United States Patent
Johnson et al.

(10) Patent No.: US 11,139,635 B2
(45) Date of Patent: Oct. 5, 2021

(54) QUANTUM WELL PLACEMENT IN A TUNABLE VCSEL

(71) Applicant: Excelitas Technologies Corp., Waltham, MA (US)

(72) Inventors: Bartley C. Johnson, North Andover, MA (US); Mark E. Kuznetsov, Lexington, MA (US); Walid A. Atia, Jamaica Plain, MA (US); Peter S. Whitney, Bedford, MA (US)

(73) Assignee: Excelitas Technologies Corp., Waltham, MA (US)

(*) Notice: Subject to any disclaimer, the term of this patent is extended or adjusted under 35 U.S.C. 154(b) by 0 days.

(21) Appl. No.: 16/446,303

(22) Filed: Jun. 19, 2019

(65) Prior Publication Data

US 2019/0386461 A1 Dec. 19, 2019

Related U.S. Application Data

(60) Provisional application No. 62/687,071, filed on Jun. 19, 2018.

(51) Int. Cl.
| | |
|---|---|
| *H01S 5/068* | (2006.01) |
| *H01S 5/183* | (2006.01) |
| *H01S 5/34* | (2006.01) |
| *H01S 5/343* | (2006.01) |
| *H01S 5/028* | (2006.01) |

(52) U.S. Cl.
CPC ......... *H01S 5/068* (2013.01); *H01S 5/18361* (2013.01); *H01S 5/3408* (2013.01); *H01S 5/34313* (2013.01); *H01S 5/028* (2013.01)

(58) Field of Classification Search
CPC .. H01S 5/068; H01S 5/18361; H01S 5/34313; H01S 5/18366; H01S 5/18369; H01S 5/34

See application file for complete search history.

(56) References Cited

U.S. PATENT DOCUMENTS

| | | | |
|---|---|---|---|
| 6,195,485 B1* | 2/2001 | Coldren | H01S 5/423 385/49 |
| 6,711,203 B1 | 3/2004 | Garnache et al. | |
| 9,774,166 B2 | 9/2017 | Jayaraman et al. | |
| 2013/0243024 A1* | 9/2013 | Hara | H01S 5/343 372/45.012 |
| 2013/0343420 A1* | 12/2013 | Northrup | H01S 5/141 372/50.11 |
| 2014/0176958 A1 | 6/2014 | Flanders et al. | |
| 2014/0268169 A1 | 9/2014 | Jayaraman et al. | |

(Continued)

OTHER PUBLICATIONS

Babic, D.I., et al., "Analytic Expressions for the Reflection Delay, Penetration Depth, and Absorptance of Quarter-Wave Dielectric Mirrors," IEEE Journal of Quantum Electronics, 28(2): 514-524 (1992).

(Continued)

*Primary Examiner* — Yuanda Zhang
(74) *Attorney, Agent, or Firm* — HoustonHogle LLP

(57) ABSTRACT

Quantum well designs for tunable VCSELs are disclosed that are tolerant of the wavelength shift. Specifically, the active region has even number of substantially uniformly spaced (¼ of the center wavelength in the semiconducting material) quantum wells.

18 Claims, 5 Drawing Sheets

(56) References Cited

U.S. PATENT DOCUMENTS

2015/0043002 A1    2/2015   Kuznetsov et al.
2016/0087407 A1*   3/2016   Moloney .................. H01S 5/34
                                                      372/18

OTHER PUBLICATIONS

Kuznetsov, M., et al., "Design and Characteristics of High-Power (>0.5-WCW) Diode-Pumped Vertical-External-Cavity Surface-Emitting Semiconductor Lasers with Circular TEM00 Beams," IEEE Journal of Selected Topics in Quantum Electronics, 5(3): 561-573 (1999).

Michalzik, R., et al., "Operating Principles of VCSELs," Chap. 3 in Vertical-Cavity Surface-Emitting Laser Devices, H. Li and K. Iga (Eds.), pp. 53-98. Berlin: Springer-Verlag, 2003.

International Search Report and Written Opinion of the International Searching Authority, dated Oct. 4, 2019, from International Application No. PCT/US2019/038009, filed on Jun. 19, 2019. 16 pages.

Qiao, P., et al., "Wavelength-Swept VCSELs," IEEE Journal of Selected Topics in Quantum Electronics, 23(6): 1-16 (2017).

International Preliminary Report on Patentability, dated Dec. 30, 2020, from International Application No. PCT/US2019/038009, filed on Jun. 19, 2019. 9 pages.

* cited by examiner

QUANTUM WELL PLACEMENT IN A TUNABLE VCSEL

RELATED APPLICATIONS

This application claims the benefit under 35 USC 119(e) of U.S. Provisional Application No. 62/687,071, filed on Jun. 19, 2018, which is incorporated herein by reference in its entirety.

BACKGROUND OF THE INVENTION

In vertical cavity surface emitting laser (VCSEL) design, it is well known that the quantum wells need to be placed at antinodes of the standing wave light field to extract the maximum optical gain. R. Michalzik and K. J. Ebeling, "Operating Principles of VCSELs", Chap. 3 in Vertical-Cavity Surface-Emitting Laser Devices, H. Li and K. Iga (Eds.), pp. 53-98. Berlin: Springer-Verlag, 2003. This strategy has been used in tunable VCSEL design as well. See V. Jayaraman, C. Burgner, D. John, P. Heim, A. E. Cable, "Widely Tunable Swept Source", U.S. Pat. No. 9,774,166 B2, 26 Sep. 2017.

A big difference between tunable and fixed wavelength VCSELs is that the field antinodes shift spatially with laser wavelength as the laser is tuned. Staggering the position of a single well per antinode has been shown to produce wavelength insensitivity. M. Kuznetsov, F. Hakimi, R. Sprague, and A. Mooradian, "Design and Characteristics of High-Power (>0.5-W CW) Diode-Pumped Vertical-External-Cavity Surface-Emitting Semiconductor Lasers with Circular $TEM_{00}$ Beams", IEEE J. Selected Topics in Quantum Electronics, 5, 561-573 (1999).

SUMMARY OF THE INVENTION

The present invention concerns VCSEL designs that are tolerant of the standing wave position shift with wavelength when wavelength shift using quantum well pairs.

In general, according to another aspect, the invention features a tunable VCSEL with an active region with an even number of substantially uniformly spaced (¼ of the laser center wavelength in the semiconducting material) quantum wells.

It should be noted that an odd number of wells could be used, for example, by sticking an extra well on the side.

In embodiments, the center wavelength is between 950 and 1150 nanometers, such as about 1050 nanometers.

The VCSEL might actually comprise at least two pairs of quantum wells wherein a spacing between the quantum wells of each pair is ¼ of the center wavelength in the semiconducting material of the active region.

Or, the VCSEL might actually comprise at least three pairs of quantum wells wherein the spacing between the quantum wells of each pair is ¼ of the center wavelength in the semiconducting material of the active region.

In a current implementation, the VCSEL comprises a membrane device and a half VCSEL device containing the active region. The membrane device can be bonded to the half VCSEL device. Also, the polarization is usually controlled.

The VCSEL will also usually comprise a distributed Bragg reflector on one side of the active region. It can be constructed from $SiO_2/Ta_2O_5$.

In general, according to another aspect, the invention features a tunable vertical cavity surface emitting laser (VCSEL) with an active region with at least one pair of quantum wells, wherein at a center wavelength of a tuning range, quantum wells of the active regions are located on either side of an antinode of a standing wave inside the VCSEL.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

It will be understood that although terms such as "first" and "second" are used herein to describe various elements, these elements should not be limited by these terms. These terms are only used to distinguish one element from another element. Thus, an element discussed below could be termed a second element, and similarly, a second element may be termed a first element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As an example, here we present calculations for strained InGaAs quantum wells grown on a GaAs substrate which emit in a 100 nanometers (nm) or more band around 1050 nm (950-1150 nm). These design principles apply to other semiconductor material systems for the 1310 nm, 1550 nm and other wavelength bands.

Figure 1A:
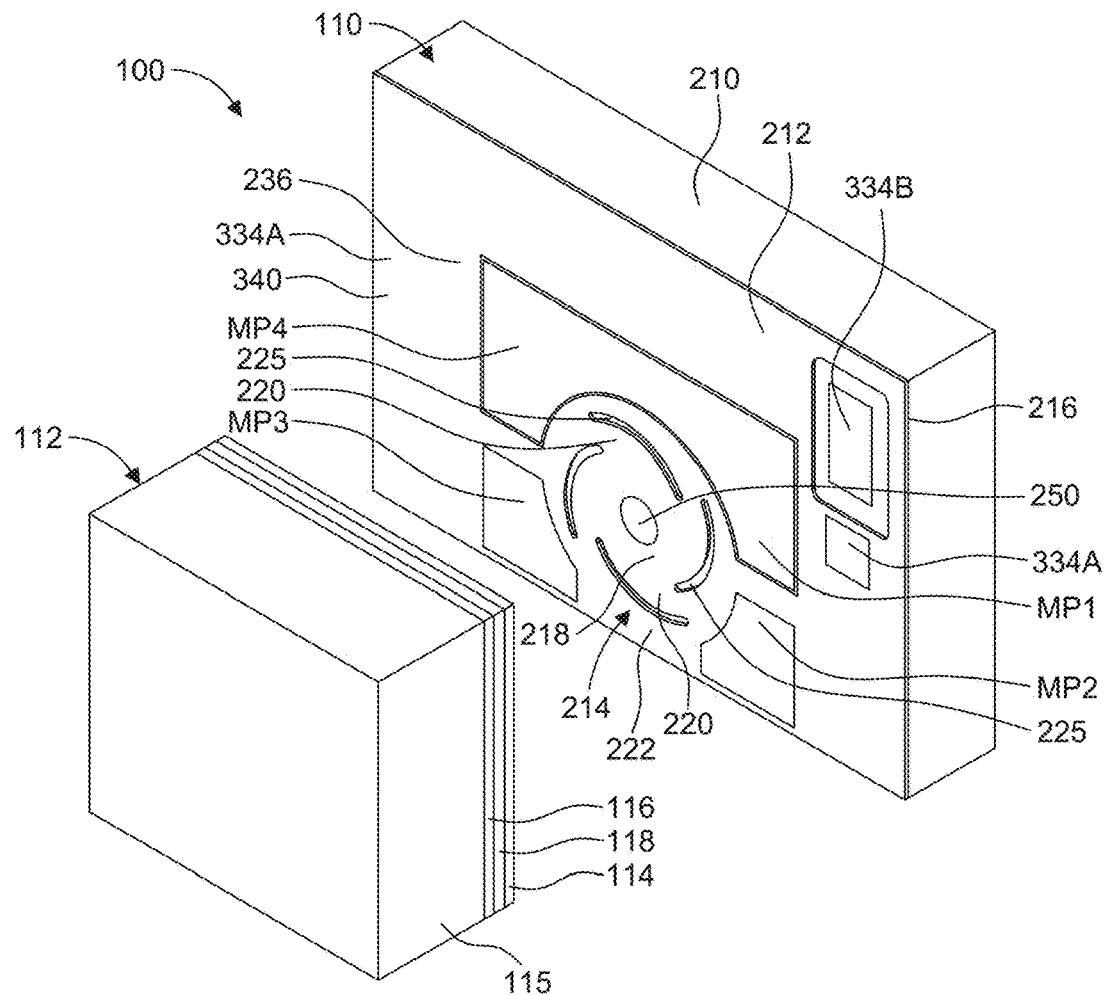
FIG. 1A is an exploded perspective view of a wafer- or die-bonded tunable VCSEL to which the present invention is applicable, in one example.
Figure 1B:
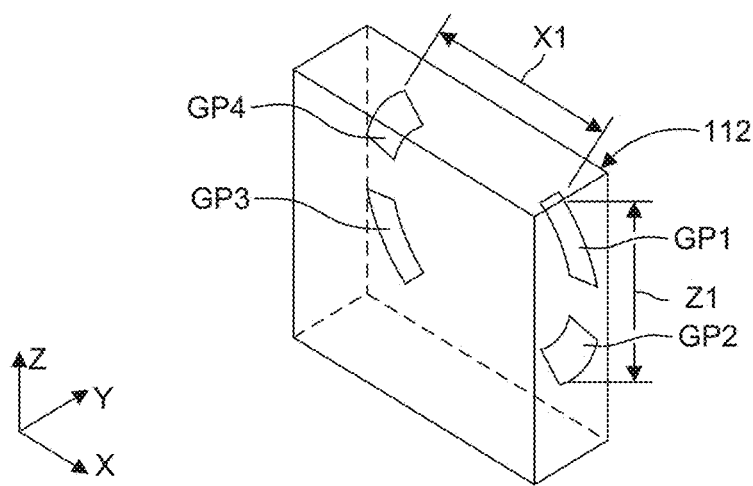
FIG. 1B is a schematic perspective view of the half VCSEL showing the locations of the bond pads.

An example of a MEMS tunable VCSEL 100 is presented in FIGS. 1A and 1B. Many designs are possible, but this one is formed by bonding a ½ or half VCSEL chip or device 112 with an active region and semiconductor distributed Bragg reflector (DBR) to a silicon MEMS optical membrane device 110 with an electrostatically movable mirror for wavelength tuning.

In more detail, the optical membrane device 110 comprises handle wafer material 210 that functions as a support. Currently, the handle is made from doped silicon, with a resistivity<0.1 ohm-cm, carrier concentration>$1 \times 10^{17}$ cm$^{-3}$, to facilitate electrical contact.

An optical membrane or device layer 212 is added to the handle wafer material 210. Typically, silicon on isolator (SOI) wafers are used. An optical membrane structure 214 is formed in this optical membrane layer 212. In the current implementation, the membrane layer 212 is silicon that is low doped with resistivity>1 ohm-cm, carrier concentration<$5 \times 10^{15}$ cm$^{-3}$, to minimize free carrier absorption of the transmitted light. For electrical contact, the membrane layer surface is usually additionally doped by ion implantation to create a highly doped surface layer (doped usually to >$1 \times 10^{18}$ cm$^{-3}$, but at least $1 \times 10^{17}$ cm$^{-3}$ and at least 200 Angstroms (A) thick, usually 500-2000 A thick). This method minimizes optical absorption in the membrane layer itself that would occur if the entire layer were highly doped. An insulating (buried silicon dioxide) layer 216 separates the optical membrane layer 212 from the handle wafer material 210.

During manufacture of the membrane device in the SOI wafer material, the insulating layer 216 functions as a sacrificial/release layer, which is partially removed to release the membrane structure 214 from the handle wafer material 210. Then during operation, the remaining portions of the insulating layer 216 provide electrical isolation between the patterned device layer 212 and the handle material 210.

In the current embodiment, the membrane structure 214 comprises a body portion 218. The optical axis of the device 100 passes concentrically through this body portion 218 and orthogonal to a plane defined by the membrane layer 212. A diameter of this body portion 218 is preferably 300 to 600 micrometers; currently it is about 500 micrometers.

Tethers 220 (four tethers in the illustrated example) are defined and delineated by arcuate slots 225 fabricated into the device layer 212. The tethers 220 extend radially from the body portion 218 to an outer portion 222, which comprises the ring where the tethers 220 terminate. In the current embodiment, a spiral tether pattern is used.

A membrane mirror dot 250 is disposed on body portion 218 of the membrane structure 214. In some embodiments, the membrane mirror 250 is optically curved to form an optically concave optical element to thereby form a curved mirror laser cavity. In other cases, the membrane mirror 250 is a flat mirror, or even possibly convex.

When a curved membrane mirror 250 is desired, this curvature can be created by forming a depression in the body portion 218 and then depositing the material layer or layers that form mirror 250 over that depression. In other examples, the membrane mirror 250 can be deposited with a high amount of compressive material stress that will result in its curvature.

The membrane mirror dot 250 is preferably a reflecting dielectric mirror stack. In some examples, it is a dichroic mirror-filter that provides a defined reflectivity, such as between 1 and 99.9%, to the wavelengths of laser light generated in the laser 100, whereas the optical dot 250 is transmissive to wavelengths of light that are used to optically pump the active region in the VCSEL device 112. In still other examples, the optical dot is a reflective metal layer such as aluminum or gold.

In the illustrated embodiment, four metal pads MP1, MP2, MP3, and MP4 are deposited on the proximal side of the membrane device 110. These are used to solder or thermocompression bond, for example, the half VCSEL device 112 onto the proximal face of the membrane device 110.

Also provided are two wire bondpads 334A, 334B. Membrane wire bond pad 334A is used to provide an electrical connection to the membrane layer 212 and thus the membrane structure 214. The handle wire bond pad 334B is used to provide an electrical connection to the handle wafer material 210.

The half VCSEL device 112 generally comprises an antireflective coating 114, which is optional, and an active region 118. The cap layer can be used between the antireflective coating 114, if present, and the active region 118. The cap layer protects the active region from the surface/interface effects at the interface to the AR coating and/or air.

A back mirror 116 of the laser cavity is defined by a distributed Bragg reflector (DBR) mirror. Generally, the back mirror 116 may be a semiconductor DBR, a dielectric DBR. In addition, a hybrid dielectric DBR/metal mirror might be used. as disclosed in US Patent Application Pub. No. US 2015/0043002 A1, on Feb. 12, 2015, which is incorporated herein by this reference.

A half VCSEL spacer 115, such as GaAS, functions as a substrate and mechanical support. The DBR can be grown into the semiconductor, or be a deposited dielectric DBR, or hybrid metal/dielectric mirror deposited near the active layer after etching a hole or "port" in the semiconductor substrate.

The material system of the active region 118 of the VCSEL device 112 is selected based on the desired spectral operating range. Common material systems are based on III-V semiconductor materials, including binary materials, such as GaN, GaAs, InP, GaSb, InAs, as well as ternary, quaternary, and pentenary alloys, such as InGaN, InAlGaN, InGaP, AlGaAs, InGaAs, GaInNAs, GaInNAsSb, AlIn-GaAs, InGaAsP, AlGaAsSb, AlGaInAsSb, AlAsSb, InGaSb, InAsSb, and InGaAsSb. Collectively, these material systems support operating wavelengths from about 400 nanometers (nm) to 2000 nm, including longer wavelength ranges extending into multiple micrometer wavelengths. Semiconductor quantum well and quantum dot gain regions are typically used to obtain especially wide gain and spectral emission bandwidths. Quantum well layers may be purposely strained or unstrained depending the exact materials and the desired wavelength coverage.

In still other examples, the rear VCSEL distributed Bragg reflector (DBR) mirror 116 is a dichroic mirror-filter that provides a defined reflectivity, such as greater than 99% to the wavelengths of laser light generated in the laser 100, whereas the rear mirror 116 is transmissive to wavelengths of light that are used to optically pump the active region in the VCSEL device 112, thus allowing the half VCSEL device 112 to function as an input port of pump light.

In the example of a VCSEL operating with a center wavelength around 1050 nm, the mirror reflectivities tend toward higher numbers for light around 1050 nm in wavelength. For example, the reflectivity of the back mirror 116 is about 99.99%. On the other hand, the front mirror dot 250 is usually 99% or greater. In current embodiments, the mirror dot 250 has a reflectivity of about 99.4% or higher.

In operation, the VCSEL device is electrically or optically pumped. The generated light resonates between the rear mirror 116 and membrane mirror 250. The wavelength of the generated light is tuned within the scan band of the device by the out of plane electrostatic deflection of the body portion 218 and thus the membrane mirror 250 by controlling the electrostatic field between the body portion 218 and the handle wafer material 210 and/or the half VCSEL device 112.

FIG. 1B is schematic view showing the hidden bond pads VP1-VP4 on the half VCSEL device 112.

The thin gold pads VP1-VP4 on the ½ VCSEL device 112 are thermocompression bonded to corresponding membrane pads MP1, MP2, MP3, and MP4 of the MEMS membrane (mirror) device 110 by placing them in contact at high pressure and temperature to form the bond. Typically, this is done at 300-360° C. and 1-10 N force. Other elevated temperature bonding methods, such as gold-tin and/or eutectic soldering, can be used to produce a similar effect, however.

In some examples, when the bonded structure cools, strain is introduced because of the different coefficients of thermal expansion (CTE) between the silicon MEMS membrane device 110 and the substrate material used for the optical gain medium of the half VCSEL device 112. An asymmetric bond pad arrangement is used to produce asymmetric stress. Specifically, the bond pad arrangement is asymmetric in that the x-axis distance (X1) between the pads is greater than the z-axis distance (Z1) between the pads. Said another way, a distance between the bond pads is different between two axes of a plane of the membrane device and the half VCSEL device. The bond pad asymmetry is designed so that the added stress asymmetry to the ½ VCSEL from bonding to the membrane device 112 is between 20 and 100 MPa.

More details of the design and other designs can be found in US Patent Application Pub. No. US 2014/0176958 A1, filed on 21 Dec. 2012, which is incorporated herein by this reference.

The present invention concerns placement of the quantum wells within the active layer 118 relative to the DBR mirror 116 on the ½ VCSEL chip 112.

Figure 2:
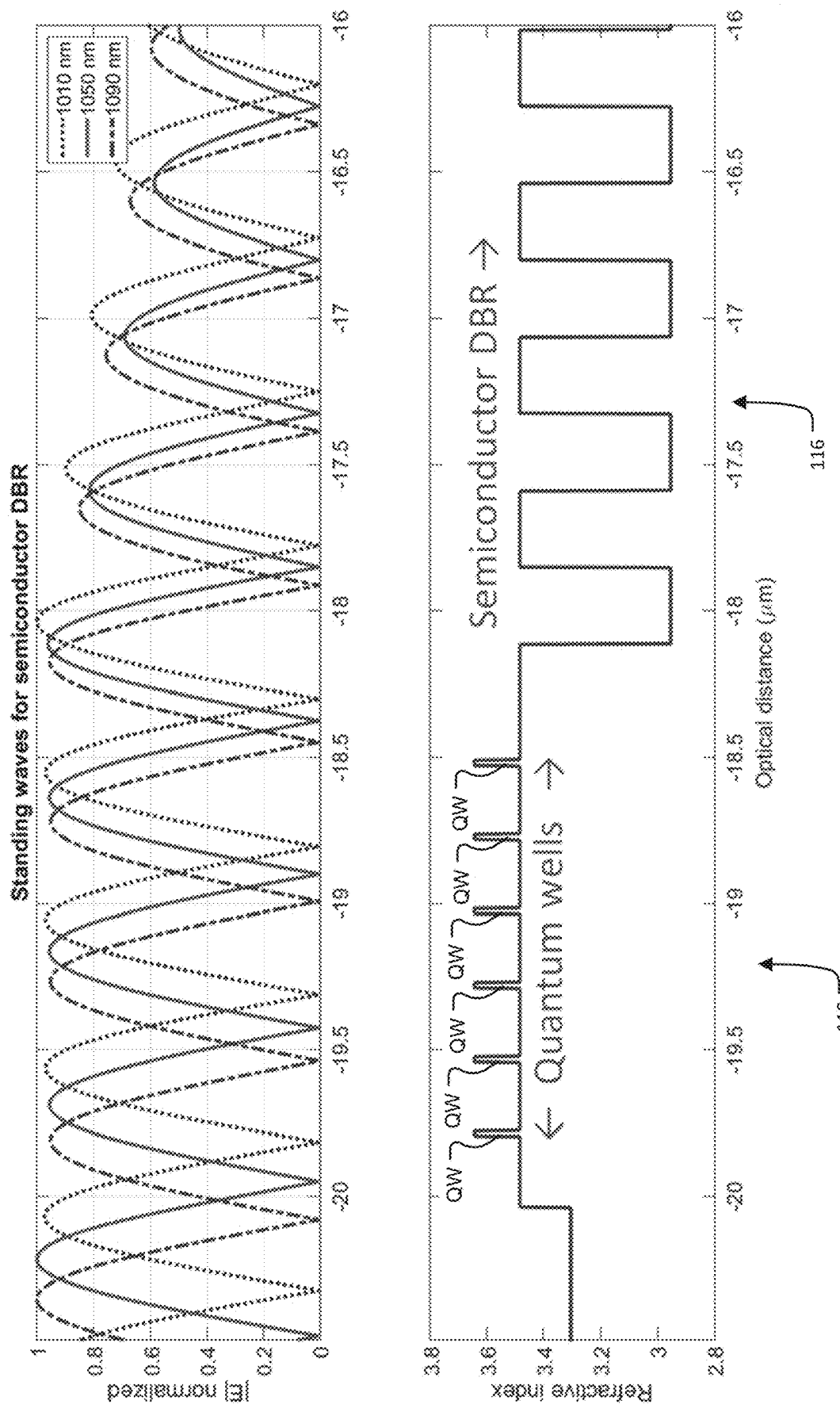
FIG. 2 is a plot of the magnitude of the electric field and refractive index as a function of optical distance within the ½ VCSEL in micrometers, for several wavelengths of laser tuning.

FIG. 2 shows calculations of how the optical standing wave shifts its spatial position relative to the DBR 116 and quantum wells QW of the active layer 118. These are plots of the optical standing waves vs. laser wavelength in relation to the quantum wells. The horizontal axis is optical distance, which is the physical distance times the refractive index of the materials. A relatively narrow band semiconductor DBR with a long group delay is used in this example.

Figure 3:
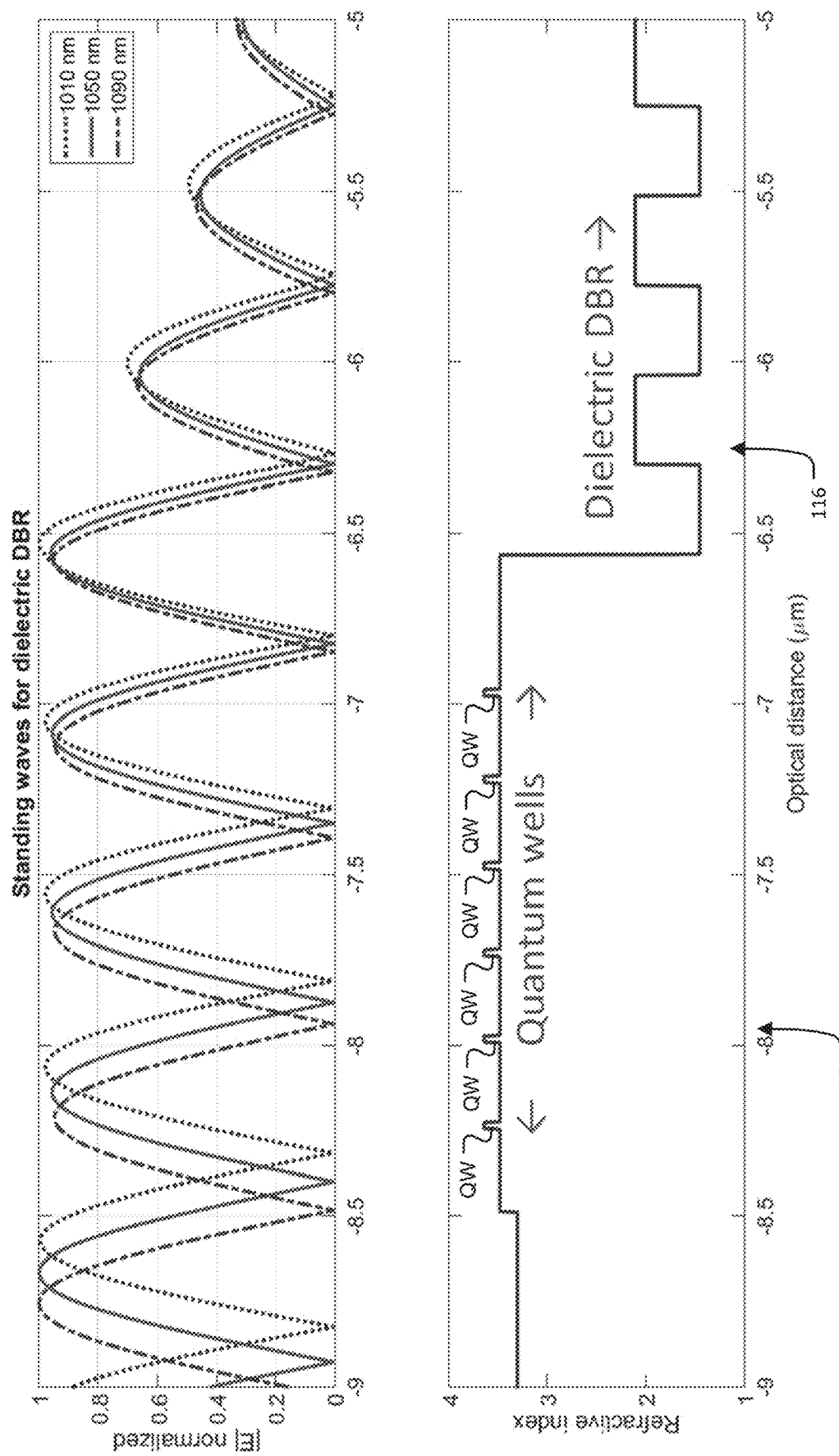
FIG. 3 is another plot of the magnitude of the electric field and refractive index as a function of optical distance (in micrometers) within the ½ VCSEL having a $SiO_2/Ta_2O_5$ dielectric distributed Bragg reflector (DBR) 116, for several wavelengths of laser tuning.

On the other hand, FIG. 3, which is also a plot of the optical standing waves vs. laser wavelength in relation to the quantum wells shows a wider band (relative to example in FIG. 2) $SiO_2/Ta_2O_5$ dielectric DBR with a shorter group delay. Thus when this DBR 116 is used, there is less spatial movement of the standing waves. Thus, the spatial shift can be mitigated somewhat by incorporating a wider bandwidth mirror that has a smaller group delay. See D. I. Babic and S. W. Corzine, "Analytic Expressions for the Reflection Delay, Penetration Depth, and Absorptance of Quarter-Wave Dielectric Mirrors", IEEE J. Quantum Electronics, 28, 514-524 (1992).

One strategy for coping with the standing wave spatial shift is to place the wells at a ¼ wavelength (wavelength in the material) spacing. That way, as the antinode (point of constructive interference and high field) moves farther away from one well in a pair, it becomes closer to the other, as seen in FIG. 4. This has several benefits: (1) Some gain is seen no matter what the tuning. (2) The active region is tolerant to design and growth errors where a single quantum well or closely spaced group may be misplaced into a node (point of destructive interference and low field). (3) There is considerable spacing between strained quantum wells so that strain compensation crystal growth techniques do not have to be used to stay below the strain-thickness product limit. (4) The design can still be optically efficient since carriers (electrons and holes) will naturally diffuse from the region around the less depleted well nearer the node to the more depleted one nearer the antinode.

Figure 4C:
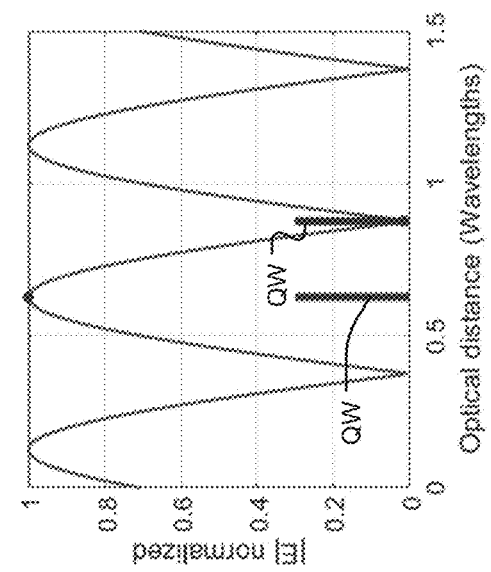
FIGS. 4A, 4B, and 4C are plots of the magnitude of the electric field as a function of optical distance in wavelengths showing the relationship between a pair of quantum wells, ¼ wave apart, and the optical standing wave at various points in the laser tuning.
Figure 4B:
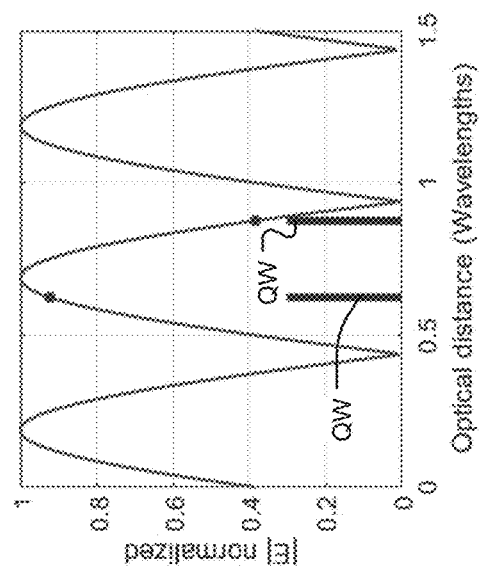
Figure 4A:
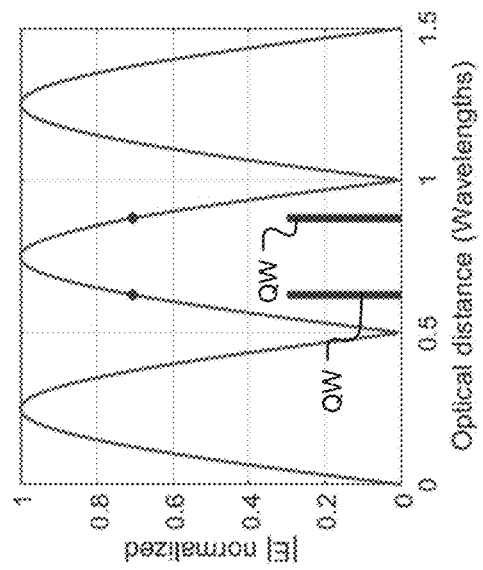

FIGS. 4A, 4B, and 4C show the relationship between a pair of quantum wells QW, ¼ wave apart, and the optical standing wave. The goal is, at the center of the tuning range, to place the quantum wells on either side of the antinode (as shown in the left-most plot). As the standing wave shifts with wavelength, one well sees a more intense light field and the other a more diminished field (center). At the extreme (right), only one well sees light field.

Using the above design principles, four preferred designs are shown in FIGS. 5A through 5D, which show four multi-quantum-well designs where quantum well pairs A, B are separated by ¼-wave optical distance.

Figure 5A:
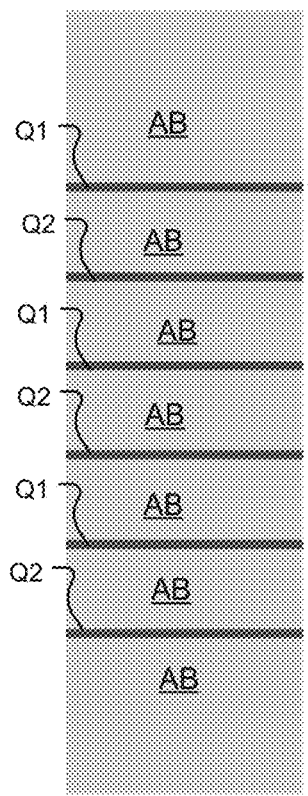
FIGS. 5A, 5B, 5C, and 5D show four different multi-quantum-well designs where quantum well pairs are separated by ¼-wave optical distance.
Figure 5B:
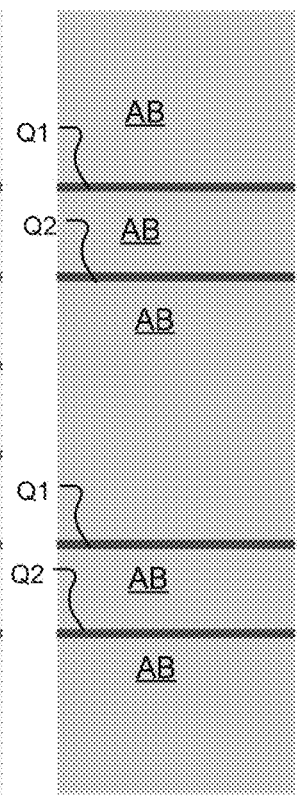
Figure 5C:
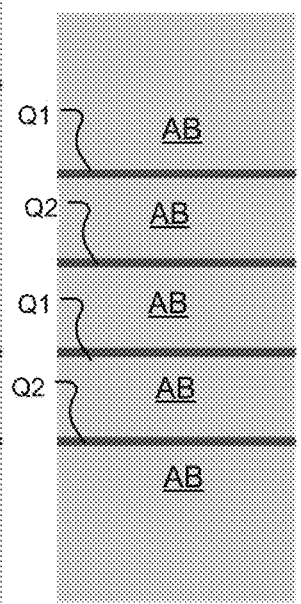
Figure 5D:
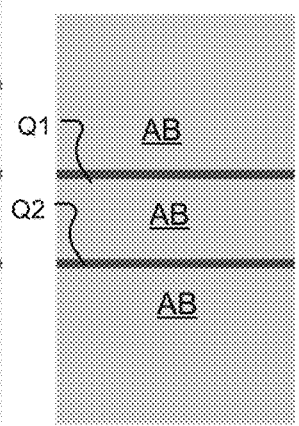

The design of FIG. 5A is a baseline six well design. In one particular implementation, it consists of six strained InGaAs wells in three pairs Q1, Q2 with GaAs absorbing barriers AB for carrier confinement and optical pump absorption. The design of FIG. 5B is a lower threshold design in that the same absorbing material (as design of FIG. 5A) feeds fewer wells. The designs of FIG. 5C and FIG. 5D have fewer wells and thinner absorbing regions to allow wider tunability since the total length of the VCSEL cavity can be shortened.

In summary, these tunable VCSEL active region designs allow for standing wave spatial shifts that occur because of the wide wavelength tunability of the laser. The designs feature wide quantum well spacing that alleviates strain-thickness issues associated with strained quantum well growth. These designs are also tolerant to design and growth errors since they do not depend on precise placement of a single or closely spaced group of wells to the antinode of the light field.

While this invention has been particularly shown and described with references to preferred embodiments thereof, it will be understood by those skilled in the art that various changes in form and details may be made therein without departing from the scope of the invention encompassed by the appended claims.

What is claimed is:

1. A tunable vertical cavity surface emitting laser (VCSEL) with an active region with at least one pair of quantum wells, wherein the quantum wells in each pair of the quantum wells are spaced from each other by a ¼ of a center wavelength of a tuning range of the VCSEL in a semiconducting material of the active region.

2. The VCSEL of claim 1, wherein the center wavelength is between 950 and 1150 nanometers.

3. The VCSEL of claim 1, wherein the center wavelength is about 1050 nanometers.

4. The VCSEL of claim 1, further comprising at least three pairs of quantum wells wherein the spacing between the quantum wells of each pair is ¼ of the center wavelength in the semiconducting material of the active region.

5. The VCSEL of claim 1, comprising:
a membrane device; and
a half VCSEL device containing the active region.

6. The VCSEL of claim 5, wherein the membrane device is bonded to the half VCSEL device.

7. The VCSEL of claim 1, wherein a polarization is controlled.

8. The VCSEL of claim 1, comprising a distributed Bragg reflector on one side of the active region.

9. The VCSEL of claim 8, wherein the distributed Bragg reflector is constructed from $SiO_2/Ta_2O_5$.

10. A tunable vertical cavity surface emitting laser (VCSEL) with an active region with at least two pairs of quantum wells, wherein at a center wavelength of a tuning range, quantum wells of the active regions are located on either side of an antinode of a standing wave inside the VCSEL, wherein a distance between a last quantum well of the active region is spaced from a beginning of a semiconductor distributed Bragg reflector by less than twice a distance between the quantum wells, wherein a spacing between the quantum wells of each pair is ¼ of the center wavelength in a semiconducting material of the active region.

11. The VC SEL of claim 10, wherein the center wavelength is between 950 and 1150 nanometers.

12. The VCSEL of claim 10, wherein the center wavelength is about 1050 nanometers.

13. The VCSEL of claim 10, further comprising at least three pairs of quantum wells wherein the spacing between the quantum wells of each pair is ¼ of the center wavelength in the semiconducting material of the active region.

14. The VCSEL of claim 10, comprising:
a membrane device; and
a half VCSEL device containing the active region.

15. The VCSEL of claim 14, wherein the membrane device is bonded to the half VCSEL device.

16. The VCSEL of claim 10, wherein a polarization is controlled.

17. The VCSEL of claim 10, comprising a distributed Bragg reflector on one side of the active region.

18. The VCSEL of claim 17, wherein the distributed Bragg reflector is constructed from $SiO_2/Ta_2O_5$.

* * * * *